United States Patent [19]

Sokolov et al.

[11] 4,235,848
[45] Nov. 25, 1980

[54] APPARATUS FOR PULLING SINGLE CRYSTAL FROM MELT ON A SEED

[76] Inventors: Anatoly M. Sokolov, Novye Cheremushki, 32a, korpus 3b, kv. 259; Oleg V. Pelevin, ulitsa Tretei linii, 13, kv. 120, both of Moscow; Anatoly I. Kirichenko, ulitsa Lenina, 45, kv. 1a, Svetlovodsk Kirovogradskoi oblasti; Grigory G. Makarenko, ulitsa Alexandra Nevskogo, 245, Zaporozhie; Lev G. Eidelman, ulitsa Otokara Yarosha, 17, kv. 53, Kharkov; Oleg S. Mjulendorf, ulitsa Geroev Truda, 47b, kv. 242, Kharkov; Valentin I. Goriletsky, ulitsa Otokara Yarosha, 17, kv. 53, Kharkov; Vitaly Y. Apilat, ulitsa 23 Avgusta, 55b, kv. 53, Kharkov; Alexei V. Radkevich, ulitsa Zernovaya, 53, kv. 56, Kharkov, all of U.S.S.R.

[21] Appl. No.: 915,754

[22] Filed: Jun. 15, 1978

[51] Int. Cl.³ .................. C30B 15/10; C30B 15/14; C30B 15/30
[52] U.S. Cl. ................... 422/249; 156/617 SP
[58] Field of Search ............ 422/249; 156/617 SP

[56] References Cited

U.S. PATENT DOCUMENTS

| | | | |
|---|---|---|---|
| 2,686,212 | 8/1954 | Horn et al. | 156/617 SP UX |
| 2,822,308 | 2/1958 | Hall | 156/617 SP UX |
| 3,338,678 | 8/1967 | Weiser et al. | 422/249 X |
| 3,359,077 | 12/1967 | Arst | 422/249 X |
| 3,637,439 | 1/1972 | DeBie | 156/617 SP X |
| 3,865,554 | 2/1975 | Wenckus et al. | 422/249 X |
| 3,953,281 | 4/1976 | Pantusco et al. | 422/249 X |

FOREIGN PATENT DOCUMENTS

| | | | |
|---|---|---|---|
| 729096 | 3/1966 | Canada | 156/617 SP |
| 1011973 | 12/1965 | United Kingdom | 156/617 SP |

*Primary Examiner*—Joseph Scovronek
*Attorney, Agent, or Firm*—Steinberg & Blake

[57] ABSTRACT

The invention relates to growing single crystals from melt. The disclosed apparatus includes a sealed chamber accommodating a crucible with the melt, the crucible being operatively connected with a drive effecting its rotation, a heater with thermal insulation means enclosing the crucible and a rod arranged coaxially with the crucible and carrying a seed holder, the rod being operatively connected with its own drive effecting its rotation and vertical displacement. In accordance with the invention, the operative connection between the crucible and its drive includes a support ring accommodated in the chamber and supporting thereon the crucible for their joint rotation during the crystal-pulling operation. The invention provides for obstruction-free supply of heat from the heater to the entire crucible surface, precludes the undesirable reduction of the temperature from the periphery of the crucible toward the center of its bottom and provides prerequisites for maintaining and desired heat distribution field within the melt.

11 Claims, 3 Drawing Figures

APPARATUS FOR PULLING SINGLE CRYSTAL FROM MELT ON A SEED

The invention relates to the art of growing single crystals from a melt, and, more particularly, to pulling single crystal from melt on a seed.

FIELD OF THE INVENTION

The invention can be effectively used in growing from melt single crystals of large diameter, such as optical and scintillation single crystals (sodium chloride, potassium chloride, potassium bromide, lithium fluoride, sodium iodide, cesium iodide, etc.), as well as semiconductor single crystals (germanium, silicon, solid solutions of tin and lead tellurides).

STATE OF THE ART

The known apparatus for pulling single crystals from melt on a seed by the Czochralski method comprise a sealed chamber with water-cooled walls, the chamber accommodating in the lower part thereof a crucible of which the vertical axis in most cases is aligned with the vertical axis of the chamber. The crucible is enclosed within a heater encompassed by thermal insulation means. The upper part of the chamber accommodates a vertical rod of which the axis is aligned with that of the crucible. The rod is sealingly received through the top or lid of the chamber and is axially reciprocable. The lower end of the rod carries the seed holder, while its upper end is associated with means for rotating and axially reciprocating this rod.

A single crystal is pulled, as follows.

The initial material is melted in the crucible, whereafter the rotating rod with the seed is lowered until the seed comes into contact with the melt. Following partial melting away of the lowermost end of the seed, the melt temperature is somewhat lowered to discontinue the melting of the seed. Then the rotating rod with the seed is slowly pulled, with the single crystal growing on the seed, its diameter being predetermined by the corresponding adjustment of the melt temperature.

Obtaining single crystals with preselected properties and perfect crystalline structure is dependent on the compliance with a series of complicated requirements, such as the provision for the stability and axial symmetry of the temperature field in the growing single crystal and the melt surrounding it, the maintenance of the present solid-liquid interface shape, the provisions for adequate agitation of the melt to wash over the solid-liquid interface, the provisions for a stable growth rate and the permanent diameter of the growing single crystal.

Although the abovedescribed apparatus of the prior art for pulling crystals by the Czochralski method, as compared with other known devices for growing single crystals from melt, enable to obtain single crystals of higher quality (the more perfect structure, the precise crystallographic orientation, the more uniform distribution of the doping impurities, etc.), its disadvantages are the impaired axial symmetry of the temperature field of the melt in the crucible and the limited possibilities for agitating the melt by the rotating growing single crystal. The asymmetry of the temperature field in the crucible might result in crystallisation of the melt on its walls, with the surface area of the melt diminishing, and, consequently, the diameter of the single crystal which can be pulled from the given crucible diminishing accordingly. Furthermore, the asymmetry of the temperature field of the melt may bring about undesirable periodic fluctuation of the growth rate, expressable as a multiple of the full revolution time. On account of the eventual deviation of the gravity centre of the growing single crystal from the axis of its rotation, the angular speed of the seed holder rod cannot be made indefinitely high, which curbs down still further the capacity of agitating the melt by the rotating growing single crystal.

There is also known an apparatus (see the U.S. Pat. No. 3,865,554, dated 1975) comprising a sealed chamber accommodating a rotating seed holder rod arranged coaxially with the chamber and a crucible supported by a mount fast with a vertical rod sealingly extending through the bottom of the chamber coaxially therewith and associated with means effecting its rotation, arranged under the bottom of the chamber. The crucible and the stand are enclosed within a heater encompassed in thermal insulation means.

The pulling of the single crystal in this apparatus is effected with simultaneously rotating both the rod of the seed holder and the crucible with the melt, and it is possible to rotate them in opposite directions.

The apparatus of this type provide for axial symmetry of the temperature field of the melt in the crucible and its intense agitation by the growing single crystal.

However, on account of the intense withdrawal of heat via the bottom rod, the temperature of the central part of the crucible bottom is lower than at the periphery of the crucible, which might result in parasitic crystallization at the bottom of the crucible, i.e. in impaired conditions of the pulling of the single crystal, such as the evolution at the bottom of the crucible of gas bubbles rising through the melt body toward the solid-liquid interface and embedding themselves in the single crystal. Said disadvantage becomes particularly pronounced when large single crystals are being pulled, because, in order to ensure the steadiness of the crucible with the melt that have considerable masses, the diameter of the rod is to be made sufficiently great.

Moreover, the stand of the crucible screens away a portion of the surface of the crucible bottom from the heater, which narrows down the possibility of maintaining the required temperature field in the melt adjacent to the crucible bottom.

Altogether, the above-mentioned two disadvantages substantially affect the conditions of controlling the shape of the solid-liquid interface; thus, in the abovedescribed apparatus of the prior art it is virtually impossible to create a planar crystallization front needed as it is for obtaining perfect single crystals.

Another serious disadvantage of the apparatus of the prior art is the pollution of the melt with the crucible material, resulting from the necessity of overheating the melt to compensate for the connection of the crucible with the heat-conducting rod. Besides, the reliability of the performance of the above-described apparatus of the prior art is affected by the fact that the upper end portion of the rod of the crucible stand and the crucible stand itself are in direct proximity of the heater, which results in their intense corrosion, warping and eventual failure.

BRIEF DESCRIPTION OF THE INVENTION

It is the main object of the present invention to provide an apparatus for pulling single crystal from a melt on a seed, which should be highly reliable in operation.

It is another object of the present invention to provide an apparatus for pulling single crystal from a melt on a seed, which should be operable in a wide range of process parameters.

It is still another object of the present invention to provide the abovespecified apparatus, having a simple construction.

It is a further object of the present invention to provide the above-specified apparatus, which should provide for obstruction-free supply of heat from the heater to the entire crucible surface, without overheating the crucible walls and without the undesirable reduction of the temperature from the periphery of the crucible toward the centre of its bottom.

It is yet another object of the present invention to provide an apparatus for pulling single crystal from a melt on a seed, which should provide prerequisites for shaping any required temperature field in the melt.

It is a still further object of the present invention to provide the abovespecified apparatus, which should preclude the undesirable phenomenon of the crucible material dissolving in the melt.

With these and other objects in view, the essence of the present invention resides in that in an apparatus for pulling single crystal from a melt on a seed, comprising a sealed chamber accommodating a crucible operatively connected with a drive effecting its rotation, a heater with thermal insulation means enclosing the crucible, and a rod arranged coaxially with the crucible and carrying a seed holder, the rod being operatively connected with a drive effecting its rotation and vertical displacement, in which apparatus, in accordance with the present invention, the operative connection between the crucible and its rotation drive includes a support ring having the crucible mounted thereon for their joint rotation during the operation of pulling the single crystal.

With the crucible being mounted on a rotary support ring, its being screened out from the heater by some construction elements is eliminated; furthermore, the heat can be supplied to the entire crucible surface without obstacles, and any required temperature field can be shaped in the melt contained in the crucible without affecting the axial symmetry of this field. Hence, the herein disclosed invention provides for controlling effectively the shape of the solid-liquid interface process with intense agitation of the melt, whereby single crystals can be grown in a wide range of process parameters. Moreover, the arrangement of the crucible on the rotary support ring provides for precluding the pollution of the melt with the crucible material.

Simultaneously the present invention provides for the high performance reliability of an apparatus owing to precluding parasitic crystallization at the bottom of the crucible.

It is quite expedient that the operative connection between the crucible and its rotation drive should include a double-stage reducing gear accommodated within the chamber, the driving pinion of the first stage of this reducing gear being fast with the output shaft of another reducing gear arranged together with the drive outside the sealed chamber, the driving pinion of the second stage of the double-stage reducing gear cooperating with the support ring for rotating the latter.

The above structural features simplify the construction of the apparatus and enable to incorporate them in the existing plants for pulling single crystals by the Czochralski method, having the vertical rod sealingly extending into the chamber through the centre of its lid, so as to preclude the pollution of the melt with the crucible material.

It is expedient that the support ring should be made in the form of a toothed rim. In this way the construction of the apparatus is simplified and the reliability of its performance is enhanced.

It is not less expedient that the operative connection between the crucible and its rotation drive should include a bearing accommodated in the sealed chamber and encompassing the thermal insulation means, the stationary race of the bearing being secured at the bottom of the chamber coaxially with the seed holder rod, and a reducing gear of which the driving pinion is fast with the output shaft of the rotation drive arranged outside the chamber, and of which the driven member is in the form of a toothed rim mounted on the rotatable race of the bearing and connected with the support ring for rotating the latter.

In this way the axis of rotation of the crucible is aligned with the axis of rotation of the growing single crystal, whereby it becomes possible to pull single crystals with diameter close to that of the crucible itself.

The operation may be facilitated by mounting the support ring on a cylindrical stand having its lower end secured to the toothed rim coaxially therewith, so that the stand encloses therein the heater with the thermal insulation means.

In this way the axial symmetry of the temperature field in the chamber is positively provided for, and the operational reliability of the apparatus is enhanced, owing to the reducing gear and the bearing being arranged in a zone of the chamber, remote from the heater and close to the water-cooled wall of the chamber.

It is quite expedient that the support ring should be mounted on the stand with adjustment-wise displacement in a horizontal plane relative to the axis of the seed holder rod.

In this way it becomes easy to align the crucible axis with the axis of its rotation not only before commencing the operation of the apparatus, but also, should it become necessary, directly during the process of single crystal growing.

It may be expedient to make the support ring in the form of two concentric thin-wall rims interconnected with spokes which are uniformly circumferentially spaced and extend tangentially to the internal rim.

In this way it becomes possible to prevent the warping of the support ring on account of the radial temperature gradient, the temperature-induced deformation merely resulting in the internal and external rims turning relative to one another without departing from their coplanarity. Moreover, this structure of the support ring minimizes radial withdrawal of the heat from the crucible supported thereby, which facilitates the shaping of the required temperature field in the melt.

BRIEF DESCRIPTION OF THE DRAWINGS

The present invention will be further described in connection with the embodiments thereof, with reference being had to the accompanying drawings, wherein.

DETAILED DESCRIPTION OF THE INVENTION

Figure 1:
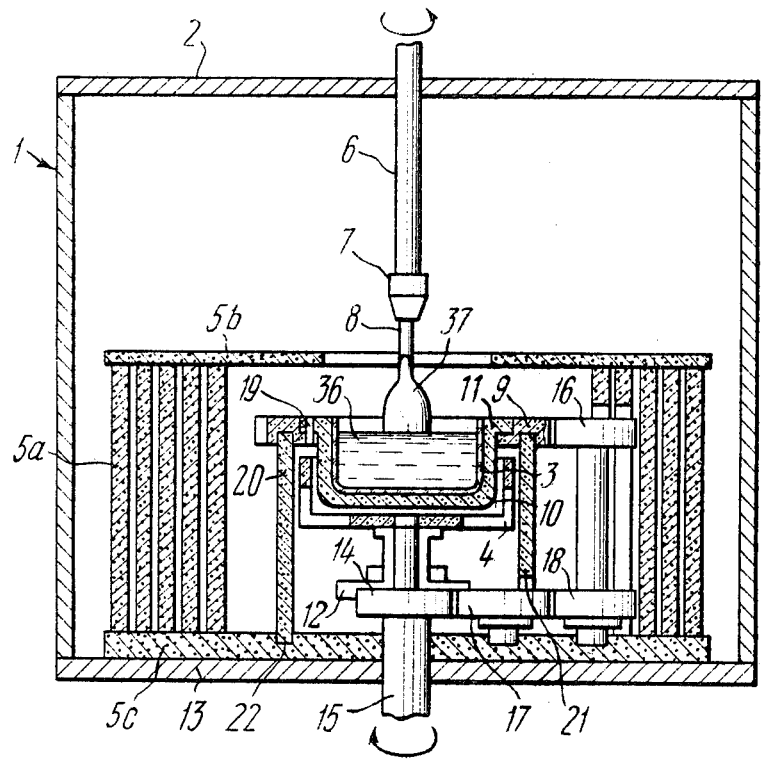
FIG. 1 is a sectional schematic view of an apparatus for pulling single crystal from melt on a seed in accordance with the invention.

The invention resides in an apparatus for pulling a single crystal from a melt on a seed. In the presently described embodiment the melt from which the single crystal is to be pulled is either a semiconductive silicon, or a solid solution of tin and lead tellurides. The apparatus schematically illustrated in FIG. 1 of the appended drawings comprises a sealed chamber 1 with a lid 2. The chamber 1 accommodates therein a crucible 3 operatively connected with a drive for effecting its rotation, and a heater 4 with thermal insulation means 5 enclosing the crucible 3.

In this embodiment the thermal insulation means is in the form of a graphite block make up of five cylindrical screens 5a, one ceiling screen 5b and one bottom screen 5c arranged at the bottom of the chamber 1. The two of the cylinder-shaped screens 5a, closest to the heater 4, are slotted to accommodate the elements of the operative connection, i.e. of the crucible-driving chain. The entire thermal insulation block is mounted on the bottom screen 5c.

Extending into the chamber 1 coaxially with the crucible 3 is a rod 6 sealingly passing through the lid 2 and carrying the holder 7 of a seed 8. The rod 6 is associated with any suitable known per se drive (not shown) for effecting its rotation and vertical reciprocation.

In the presently described embodiment the crucible material can be quartz, boron nitride, silicon nitride, etc.

The holder 7 of the seed 8 is made of graphite.

In accordance with the invention, the operative connection between the crucible 3 and its rotation drive includes a support ring 9 having the crucible 3 suspended therefrom for their joint rotation during the crystal-pulling operation.

The crucible 3 in the presently described embodiment is suspended from the support ring 9 on a holder 10 enveloping the crucible 3 and having at the top thereof the shoulder means 11 by which the holder 10 bears upon the support ring 9. In other words, in the embodiment illustrated in FIG. 1, a crucible assembly comprises the crucible 3 and the crucible holder 10. The crucible assembly is suspended at its upper region from the support ring 9 by means of the shoulder means 11.

The heater 4 is supported by current conductors 12 which sealingly extend into the chamber 1 through its bottom 13 and are secured thereto.

The operative connection or drive chain between the crucible 3 and the drive effecting its rotation includes in the presently described embodiment, in accordance with the invention, a double-stage reducing gear accommodated within the sealed chamber 1, of which the driving pinion 14 of the first stage is fast with the output shaft 15 of another known per se reducer (not shown) arranged together with its drive motor (not shown, either) outside the sealed chamber 1.

The driving pinion 14 cooperates with the driving pinion 16 of the second stage of the double-stage reducing gear through an idle pinion 17 and a driven pinion 18. In its turn, the driving pinion 16 of the second stage cooperates with the support ring 9 for rotating the latter. In the embodiment being described the support ring is a toothed rim with annular grooves 19 and 20, respectively, in its top and bottom planes.

The groove 19 receives therein the shoulder means 11 of the holder 10 of the crucible 3.

The chamber 1 accommodates therein a cylindrical mount 21 adapted to carry the support ring 9. The mount 21 has its bottom end face rigidly secured in an annular groove 22 cut in the bottom screen 5c, while its top end face is received in the annular groove 20 of the support ring 9 so that the support ring is able to rotate by sliding about the top end face of the mount 21.

Figure 2:
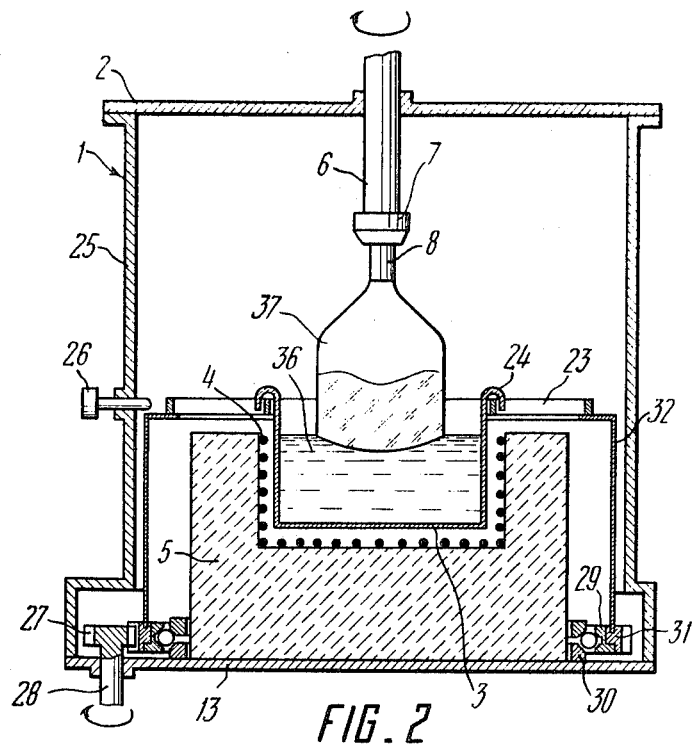
FIG. 2 is a sectional schematic view of an alternative embodiment of the invention, with a different structure of the crucible rotation drive arrangement.

FIG. 2 of the appended drawings illustrates another embodiment of the apparatus for pulling alkali halide single crystals, e.g. sodium chloride, on the seed 8 from a melt. Similarly with the previously described embodiment, the apparatus comprises a sealed chamber 1 with a lid 2. The sealed chamber 1 accommodates a crucible 3 operatively connected with the drive for effecting its rotation, a heater 4 with heat insulation means 5 enclosing the crucible 3 and a rod 6 with the holder 7 of a seed 8, extending coaxially with the crucible 3.

In accordance with the invention, the operative connection or drive chain between the crucible 3 and the drive effecting its rotation includes a support ring 23 accommodated in the chamber 1 and adapted to support thereon the crucible 3 for their joint rotation during the crystal-pulling operation.

The crucible 3 is supported by the support ring 23 with aid of hooks 24 provided at the top of the crucible 3. At the horizontal level of the support ring 23, extending sealingly into the chamber 1 through its side wall 25 is a pusher 26 provided for adjusting the position of the crucible 3 in the chamber 1. Thus, in this embodiment, the crucible assembly comprises the crucible 3 alone which is suspended at its upper region from support ring 9 by means of hooks 24.

In this embodiment the operative connection between the crucible 3 and the drive for its rotation includes, in addition to the support ring 23, accommodated in the chamber 1, a bearing and a reducing gear of which the driving pinion 27 is fast with the output shaft 28 of the rotation drive (not shown) arranged outside the chamber 1, the shaft 28 sealingly extending into the chamber 1.

The bearing is made up by a rotatable race 29 and a stationary race 30 secured at the bottom 13 of the chamber 1 coaxially with the rod 6 of the holder 7 of the seed 8. The drive member of the reducing gear is in the form of a toothed rim 31 fastened about its rotatable race 29 of the bearing and connected with the support ring 23 for rotating the latter jointly with the crucible 3.

The last-mentioned connection includes a cylindrical stand 32 carrying the support ring 23 and having its bottom end face secured to the toothed rim 31 coaxially therewith, so that the mount 32 encompasses the heater 4 with the thermal insulation means 5.

The support ring 23 is carried by the stand 32 with adjustment-wise displacement in a horizontal plane relative to the axis of the rod 6 of the holder 7 of the seed 8 and includes two concentric thin-wall rims, viz. the inner one 33 (FIG. 3) and an outer one 34 interconnected with spokes 35 wich are uniformly circumferentially spaced and extend tangentially to the internal ring 33.

OPERATING PRINCIPLE

The embodiment of the herein disclosed apparatus for pulling a single crystal, illustrated in FIG. 1, operates, as follows. Before commencing the operation, the holder 10 of the crucible 3 is mounted on the support ring 9, and the crucible 3 with the initial material is placed into the holder, whereafter the crucible rotation drive is energized. The rotation is transmitted to the crucible 3 through the driving pinion 16 of the second stage of the reducing gear, through the drive pinion 18, intermediate pinion 17, and the driving pinion 14 of the first stage from the output shaft 15 of the external reducer. The seed 8 is secured in the holder 7, and the drive rotating the rod 6 is energized. Then the appropriate conditions are set up in the chamber 1—either vacuum or counterpressure of an inert gas—and the heater 4 is energized to melt the initial material. The seed 8 is, first, lowered into the melt 36, and after the seed 8 partially melts over, it is gradually pulled by energizing the drive of the vertical displacement of the rod 6 of the holder 7 of the seed 8.

Then the temperature of the melt 36 and the pulling rate are controlled in the known per se appropriate manner to pull a single crystal 37 of the preset diameter.

The operational reliability at temperatures associated with the process can be attained by making the movable parts of the apparatus within the chamber 1 of a mechanically strong, heat-resistant material, e.g. of graphite of semiconductor purity. With both the thermal insulation and the double-stage reducer made of graphite, the high sterility of the crystallization process is provided for.

Figure 3:
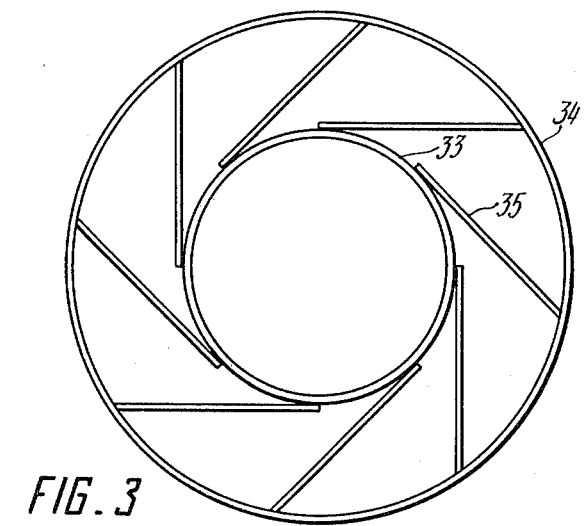
FIG. 3 is a plan view of the support ring in accordance with one of the features of the present invention.

The embodiment of the presently disclosed apparatus, illustrated in FIGS. 2 and 3, operates, as follows. Before commencing the operation, the crucible 3 is mounted on the support ring 23, and the initial material (potassium chloride, for instance) is charged into the crucible. Then the rotation drive of the crucible 3 is energized to transmit the driving torque from the output shaft 28 to the crucible 3 via the driving pinion 27, the toothed rim 31, the cylindrical stand 32 and the support ring 23. Then the set screw or pusher 26 is operated to center the crucible 3 jointly with the support ring for the axis of the crucible to be aligned with the axis of its rotation and with the axis of the rod 6 of the holder 7 of the seed 8. The seed 8 is then secured in the holder 7, and the drive rotating the rod 6 is energized. Then the heater 4 is energized to melt the initial material. The seed 8 is slowly lowered until it comes into contact with the melt 36. Following the partial melting-over of the seed 8 and establishment of a balanced state between the seed 8 and the melt 36, i.e. the state where neither melting of the seed 8 nor crystallisation of the melt thereon takes place, the drive effecting the vertical displacement (in this case, the raising) of the rod 6 of the holder 7 of the seed 8 is energized. The subsequent control of the pulling rate and of the heater temperature provides for the single crystal 37 of the required diameter growing on the seed 8.

As it can be seen from the above detailed description of the embodiments of the herein disclosed apparatus, the present invention provides for precluding the overheating of the melt and the eventually resulting pollution of the melt with the crucible material (e.g. when either silicon or tin and lead tellurides single crystals are pulled from the melt in a quartz crucible). Furthermore, the present invention provides for having any preset distribution of the specific heating intensity over the entire crucible surface and thus for obtaining any desired temperature field in the melt. In combination with the provision for rotating the crucible at any required speed in the direction opposite to that of the rotation of the growing single crystal, this enables to control effectively the shape of the solid-liquid interface process and the degree of the agitation of the melt.

All in all, the present invention substantially enhances the quality of single crystals being grown.

What is claimed is:

1. An apparatus for pulling single crystal from a melt on a seed, comprising: a sealed chamber; a seed holder; a crucible assembly adapted to contain the melt therein, accommodated in said sealed chamber; a heater accommodated in said sealed chamber and enclosing said crucible assembly; thermal insulation means accommodated in said sealed chamber and encompassing said heater and said crucible assembly; a rod carrying said seed holder, arranged coaxially with said crucible assembly; drive means for effecting rotation and vertical reciprocation of said rod; a rotatable support ring located within said chamber, said crucible assembly being suspended at an upper region thereof from said support ring; means for supporting said support ring in said sealed chamber and rotational drive means for rotating said support ring whereby said crucible assembly suspended therefrom is simultaneously rotated.

2. An apparatus as set forth in claim 1, wherein said rotation drive includes a double-stage reducing gear accommodated in said sealed chamber, including a first stage having a driving pinion being fast with an output shaft of another reducing gear having a drive located outside said sealed chamber, and a second stage of said double-stage reducing gear having a driving pinion cooperating with said support ring for rotating the latter.

3. An apparatus as set forth in claim 2, wherein said support ring is a toothed rim meshing with said driving pinion of the second stage of said double-stage reducing gear.

4. An apparatus as set forth in claim 1, wherein said rotation drive includes a bearing accommodated in said sealed chamber, having a stationary race secured to the bottom of said sealed chamber coaxially with said rod of said seed holder, and a reducing gear having a driving pinion fast with an output shaft of said rotation drive arranged outside said chamber and of which the driven member includes a toothed rim mounted on the rotatable race of said bearing and coupled with said support ring for rotating the latter.

5. An apparatus as set forth in claim 4, wherein said supporting means comprises a cylindrical stand having its bottom end secured to said toothed rim coaxially therewith and encompassing therein said heater with said thermal insulation means; and further comprising hook means for suspending said crucible assembly from said support ring.

6. An apparatus as set forth in claim 5 and further comprising means for mounting said support ring on said cylindrical stand with adjustment-wise displacement in a horizontal plane relative to the axis of said rod of said seed holder.

7. An apparatus as set forth in claim 4, wherein said support ring is made up of concentric internal and external thin-wall rims interconnected with spokes uniformly circumferentially spaced and extending tangentially to said internal rim.

8. An apparatus as set forth in claim 5, wherein said support ring is made up of concentric internal and external thin-wall rims interconnected with spokes uniformly circumferentially spaced and extending tangentially to said internal rim.

9. An apparatus as set forth in claim 6, wherein said support ring is made up of concentric internal and external thin-wall rims interconnected with spokes which are uniformly circumferentially spaced and extending tangentially to said internal rim.

10. An apparatus as set forth in claim 1, wherein said sealed chamber has a bottom, said means for supporting said support ring including a vertical cylindrical mount which has a lower portion mounted on said bottom of said sealed chamber, and an upper portion on which said support ring is supported.

11. An apparatus as set forth in claim 1, wherein said crucible assembly comprises a holder and crucible held therewithin, said support ring suspending said holder along an upper circumferentially extending region thereof.

* * * * *